US006963620B2

(12) United States Patent
Lee et al.

(10) Patent No.: US 6,963,620 B2
(45) Date of Patent: Nov. 8, 2005

(54) COMMUNICATION TRANSMITTER USING OFFSET PHASE-LOCKED-LOOP

(75) Inventors: Kang-Yoon Lee, Seoul (KR); Eunseok Song, Seoul (KR); Jeong Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 10/284,342

(22) Filed: Oct. 31, 2002

(65) Prior Publication Data

US 2004/0086057 A1 May 6, 2004

(51) Int. Cl.[7] .......................... H04L 27/04; H04L 27/12; H04L 27/20; H03D 3/24
(52) U.S. Cl. ........................ 375/295; 375/376; 331/18; 332/127
(58) Field of Search ................................. 327/105, 119, 327/147, 156, 162; 375/295, 306, 307, 308, 344, 373, 375, 376; 332/100, 103, 117, 127, 144; 455/76, 119, 260; 331/1 R, 18, 25

(56) References Cited

U.S. PATENT DOCUMENTS

| | | | | |
|---|---|---|---|---|
| 5,184,093 A | * | 2/1993 | Itoh et al. ..................... 331/25 |
| 5,717,719 A | * | 2/1998 | Park et al. .................... 375/298 |
| 6,018,275 A | * | 1/2000 | Perrett et al. ................ 332/127 |
| 6,115,079 A | * | 9/2000 | McRae .......................... 348/731 |
| 6,122,326 A | * | 9/2000 | Jackson et al. .............. 375/308 |
| 6,483,388 B2 | * | 11/2002 | Khan ............................ 331/18 |
| 2003/0092414 A1 | * | 5/2003 | Shi et al. ...................... 455/260 |

\* cited by examiner

Primary Examiner—Betsy L. Deppe
(74) Attorney, Agent, or Firm—Fleshner & Kim, LLP

(57) ABSTRACT

A translational-loop transmitter generates RF signals using at most one phase-locked-loop (PLL) circuit. In one embodiment, a single PLL generates two local oscillation signals. The first oscillation signal is mixed with a baseband signal to generate an intermediate frequency signal. The second oscillation signal is input into the translational loop to adjust a voltage-controlled oscillator to the desired carrier frequency. In order to perform this type of modulation, the frequencies of the local oscillation signals are set so that they are harmonically related to one another relative to the carrier frequency. Other embodiments generate only one oscillation signal. Under these conditions, the intermediate frequency signal is generated using the oscillation signal, and a frequency divider in the translational loop is used to generate a control signal for adjusting the voltage-controlled oscillator to the carrier frequency. In still other embodiments, a transmitter signal is generated without using any phase-locked-loop circuits. This is accomplished by generating an intermediate frequency signal using a crystal oscillator, and then using a frequency divider in a feedback loop to generate a control signal for adjusting the voltage-controlled oscillator to the carrier frequency. By minimizing the number of phase-locked-loop circuits in the transmitter, the size, cost, and power requirements of mobile handsets may be significantly reduced.

7 Claims, 9 Drawing Sheets

COMMUNICATION TRANSMITTER USING OFFSET PHASE-LOCKED-LOOP

FIELD OF INVENTION

The present invention generally relates to signal processing systems, and more particularly to a system and method for translating the frequencies of signals processed, for example, within a communications system.

BACKGROUND OF THE INVENTION

A number of functions must be performed in order to transmit voice, data, and other types of baseband signals within a communications system. These functions include filtering, amplifying, and then modulating the signals up to carrier frequencies sufficient to meet system specifications. The type of modulation performed serves as a basis for classifying the transmitter. When modulation (or up-conversion) of the baseband signal is performed in two steps, the transmitter is said to have a dual-conversion architecture. And, when modulation is performed in one step, the transmitter is said to have a direct-conversion architecture.

FIG. 1 shows a transmitter having a conventional dual-conversion architecture. This transmitter includes a modulator which performs up-conversion of a baseband signal in two steps. In the first step, the I and Q components of a baseband signal are converted to an intermediate frequency (IF) based on phase-shifted versions of a local oscillator signal LO1 input into mixers 1 and 2. The IF signals are then combined and converted to a carrier frequency based on a second local oscillator signal LO2 input into mixer 3. Finally, the resulting RF signal is filtered, amplified, and transmitted through an antenna for subsequent demodulation in a receiver.

FIG. 2 shows a transmitter having a conventional direct-conversion architecture. Unlike the dual-conversion transmitter, the direct-conversion transmitter generates an RF transmission signal using only one modulation step. Prior to modulation, digital signals along the I and Q channels are converted to analog signals by DAC 4, filtered in LPF 5, and amplified by VGA 6. The signals are then modulated by respectively mixing them with phase-shifted versions of a local oscillator signal LO in mixers 8 and 9. Because the local oscillation signal is set to the carrier frequency, modulation is performed in a single step. To complete the process, the modulated signals are combined, amplified, filtered, and transmitted to a receiver through an antenna. This specific modulation scheme has come to be known as direct-quadrature modulation.

FIG. 3 shows a transmitter having a third conventional architecture known as a translational-loop or offset phase-locked-loop (OPLL) architecture. Like the dual-conversion transmitter, a translational-loop transmitter uses two PLL circuits to generate an RF signal. However, the translational-loop transmitter uses its PLL circuits in a very different way.

The translational-loop transmitter differs from the dual-conversion transmitter by the way in, which frequency translation is performed. In the architecture of FIG. 1, an intermediate frequency (IF) signal is translated to carrier frequency by a mixer 3, which mixes the IF signal with a second local oscillation signal. In a translational-loop transmitter, this mixer is replaced with a control unit 20 which performs the translation to carrier frequency.

The control unit includes a phase and frequency detector and clock frequency (PFD & CF) unit 22, a filter 24, and a voltage-controlled oscillator 26 situated along a forward signal path of the transmitter, and a mixer 27 and a filter 28 situated along a feedback path. The manner in which the control circuit performs frequency translation will now be explained. First, a baseband signal containing information to be transmitted is input into a first mixer 10. The baseband signal may be in the form of Gaussian Minimum Shift Keying (GMSK) data and the mixer may be one similar to the first mixer of the conventional dual-conversion transmitter. As shown, mixer 10 translates the GMSK data from a baseband frequency to an intermediate frequency using local oscillation signal $F_{LO2}$ generated by phase-locked-loop circuit PLL2. Once mixed, the IF signal is filtered by a band-pass filter 15 to remove undesirable or so-called mirror frequency components.

The control loop translates the intermediate frequency signal to a carrier frequency in accordance with the following steps. First, the voltage-controlled oscillator (VCO) outputs a signal at a preset frequency $F_{VCO}$. The mixer 27 mixes this signal with a second local oscillation signal $F_{LO1}$ generated by phase-locked-loop PLL1. The output of the mixer contains two mirror frequencies $F_{VCO}+F_{LO1}$ and $F_{VCO}-F_{LO1}$. The band-pass filter 28 removes the higher-frequency signal and inputs the lower frequency signal into the PFD & CP unit.

The PFD & CP unit determines whether the frequency of the IF signal output from filter 15 matches the frequency of the signal output from filter 28. If these signals do not match, the PFD & CP unit generates a difference signal indicating the amount of frequency mismatch that exists. This difference signal is filtered by filter 22 and input into the VCO to control the frequency of $F_{VCO}$ so that the frequency output from filter 28 will match the IF signal frequency. The IF signal may therefore be referred to as a reference signal since the VCO is adjusted until the output of filter 28 ($F_{VCO}-F_{LO1}$) matches $F_{LO2}$.

Once a frequency match exists between these two signals, the PFD & CP unit compares the phase of the signal output from filter 28 with the phase of the IF signal. If there is a mis-match, the PFD & CP unit outputs a difference signal which adjusts the VCO output until the phase of the signal output from filter 28 matches the phase of the IF signal. When the frequency and phase of the output of filter 28 matches the IF signal, the frequency of the VCO will be set to the desired carrier frequency. The VCO then outputs the modulated baseband signal at the carrier frequency to an antenna for transmission.

Each of the aforementioned transmitters has benefits and drawbacks.

Dual-conversion transmitters are desirable because narrowband filtering and gain control may be implemented efficiently at the intermediate frequency (IF) stage. Also, by using two local oscillation frequencies to generate transmission signals, dual-conversion transmitters avoid a problem known as injection pulling, which is a phenomenon that usually occurs in direct-conversion transmitters. Dual-conversion transmitters also have proven to be comparatively less problematic than other types of rf transmitters.

In spite of these advantages, dual-conversion transmitters have drawbacks which make then undesirable in certain instances. Perhaps most significantly, dual-conversion transmitters require more hardware than, for example, direct-conversion transmitters. Most of this hardware is in the form of filters and oscillation circuits used to perform the first (or IF) up-conversion of the baseband signal. Dual-conversion transmitters also use separate phase-locked-loop (PLL) circuits to generate the oscillation signals required for up-conversion. While these drawbacks have proven to be significant in terms of costs and complexity, many code division multiple access (CDMA) and time division multiple access (TDMA) mobile phone systems in use today use this type of transmitter.

Direct-conversion transmitters offer advantages which dual-conversion and translational-loop transmitters cannot realize. For example, as previously discussed, direct-conversion transmitters use less hardware than dual-conversion transmitters because only one local oscillation frequency is used to generate the transmission signal. Consequently, only one PLL is required. This same advantage exists over translational-loop transmitters, which also use two PLL circuits for rf signal generation. Direct-conversion transmitters also do not require the feedback loop found in translational-loop transmitters. Consequently, direct-conversion transmitters use less hardware and therefore are more suitable for use in handsets and other highly integrated applications.

In spite of these advantages, direct-conversion transmitters have a number of significant drawbacks. For example, direct-conversion transmitters use duplex filters to meet specifications for noise reduction in the receiving bands of a communication system. These filters cause several dB of loss to occur in the transmitter which must be compensated for by additional power from a power amplifier. This so-called "back-off" power significantly reduces talk time. Consequently, direct-conversion transmitters are not the optimal choice for many mobile applications. For example, translation-loop filters (which do not use duplex filters) have generally been used in TDMA applications (e.g., GSM) over direct-conversion architectures.

Translational-loop transmitters offer advantages which neither of the previous two types of transmitters can achieve. The PLL used in the feedback loop, for example, minimizes external filtering by acting like a tracking narrowband, band-pass filter. This makes translational-loop transmitters desirable for use in GSM handsets in order to reduce cost and power consumption requirements.

Translational-loop transmitters also realize a low-noise floor. This allows the duplex filter used in direct-conversion architectures to be replaced with a simple switch. As a result, the insertion loss associated with the duplex filter is eliminated, which thereby allows the power amplifier in the transmitter to operate at low output power. Unlike in many other transmitter architectures, class-C power amplifiers may therefore be used which provide good power-added efficiency. This is especially significant in a GSM system, where the modulation is a constant-envelope signal.

An additional benefit of a translational-loop system is that the VCO strips off any residual amplitude modulation (AM) component that may exist. This allows the class-C amplifier to be driven even harder, thereby providing an additional measure of power-added efficiency.

For all their advantages, translational-loop transmitters have a number of drawbacks which make them less than optimally efficient when applied in a mobile communications system. Perhaps most significantly, these transmitters must use multiple PLL circuits to produce the oscillation signals required for translating a baseband signal to carrier frequency. These additional oscillators increase the physical dimensions and cost of the handset, as well as its power requirements. As a result, conventional translational-loop transmitters deplete the charge stored in the battery of the handset at a faster than desired rate.

A need therefore exists for an improved system and method for modulating signals in a translational-loop transmitter, and more particularly which generates modulated signals in a more economical and power-efficient manner compared with conventional translational-loop transmitters and with a more highly integrated architecture which consumes less space when incorporated within, for example, a mobile handset.

SUMMARY OF INVENTION

It is one object of the present invention to provide an improved system and method for modulating signals in a translational-loop transmitter.

It is another object of the present invention to achieve the aforementioned object by generating modulated signals in a more economical and power-efficient manner compared with conventional translational-loop transmitters.

It is another object of the present invention to achieve the aforementioned object by using fewer oscillations circuits and/or less complex hardware than is used in conventional translational-loop transmitters.

It is another object of the present invention to provide a translational-loop transmitter which is more highly integrated than conventional transmitters of this type, and which therefore consumes less space when incorporated within, for example, a mobile handset.

It is another object of the present invention to provide an improved method for generating oscillation signals for performing frequency translations in a translational-loop modulator.

These and other objects and advantages of the present invention are achieved by providing a system and method which generates transmitter signals using at most one phase-locked-loop circuit. In accordance with one embodiment of the invention, the system includes a phase-locked-loop unit which generates a reference oscillation signal, and a local oscillator signal generator which generates a first and second oscillation signals from the reference signal. The first and second oscillation signals are harmonically related relative to a desired carrier frequency, and their frequencies are selected to ensure that their sum equals the carrier frequency. To generate the transmitter signal, the first oscillation signal is mixed with a baseband signal to form an intermediate frequency signal, and the second oscillation signal is input into a translational-loop to be used as a basis for translating the IF signal to carrier frequency.

A second embodiment of the system of the present invention includes a first oscillator which generates an oscillation signal, a mixer which mixes the oscillation signal with an input signal to generate an intermediate frequency signal, a divider which divides a frequency of a second oscillator to generate a feedback signal, and a comparator which compares the feedback signal to the intermediate frequency signal to generate a difference signal, and which outputs a control signal for setting the second oscillator to a desired carrier frequency based on the difference signal. The divider and comparator may be included in a translational-loop of a transmitter. Under these circumstances, if the frequency of the first oscillator is $$\frac{N}{M}F_C,$$

the divider is set to multiply the frequency of the second oscillator by $$\frac{N}{M},$$

where N and M are integers. The first oscillator may be a phase-locked-loop unit and the second oscillator may be a voltage-controlled oscillator.

A third embodiment of the system of the present invention is similar to the second embodiment except that if the first oscillator is set to a frequency of $$\frac{N}{M}F_C,$$

a frequency divider then multiplies the output of the first oscillator by 1/M and the frequency of the second oscillator is multiplied by the fraction 1/N. Given these parameters, the translational-loop of the transmitter outputs the modulated signal at the desired carrier frequency.

A fourth embodiment of the system of the present invention generates oscillation signals without using a phase-locked-loop at all. This system includes a first oscillator which generates a crystal oscillation signal, a mixer which mixes an input signal with the crystal oscillation signal to generate an intermediate frequency signal, a divider which divides a frequency of a second oscillator to generate a feedback signal, and a comparator which compares the feedback signal to the intermediate frequency signal to derive a difference signal, and which outputs a control signal for setting the second oscillator to a desired carrier frequency based on the difference signal. The divider divides the frequency of the second oscillator by a value which causes a frequency of the feedback signal to equal a frequency of the intermediate frequency signal. And, the second oscillator may be a voltage-controlled oscillator.

The various embodiments of the method of the present invention perform the functions of the systems previously described. With such a system and method, the number of phase-locked-loop circuits employed in conventional translation-loop transmitters may be significantly reduced or altogether eliminated. This allows the size and power requirements of mobile handsets to be reduced, thereby improving miniaturization and providing for a longer battery life.

BRIEF DESCRIPTION OF THE DRAWINGS

The invention will be described in detail with reference to the following drawings in which like reference numerals refer to like elements wherein.

DETAILED DESCRIPTION OF THE INVENTION

The present invention is a system and method for modulating signals in a communications system. The invention is particularly well suited to modulating signals in a translational-loop transmitter (otherwise known as offset phase-locked-loop) of a wireless communications system, however those skilled in the art can appreciate that the invention is not limited to this application. For example, the invention may be used to modulate signals in wired communications systems using contant envelope modulation, or in any other system where modulated signals are used. The present invention is also not limited to generating modulated signals, but rather may be employed in any system where frequency translations are required. For example, if desired the invention may be used to generate local oscillation signals for demodulating signals in a communications receiver. For illustrative purposes only, the invention will hereinafter be described with respect to an application within a translational-loop transmitter.

Figure 1:
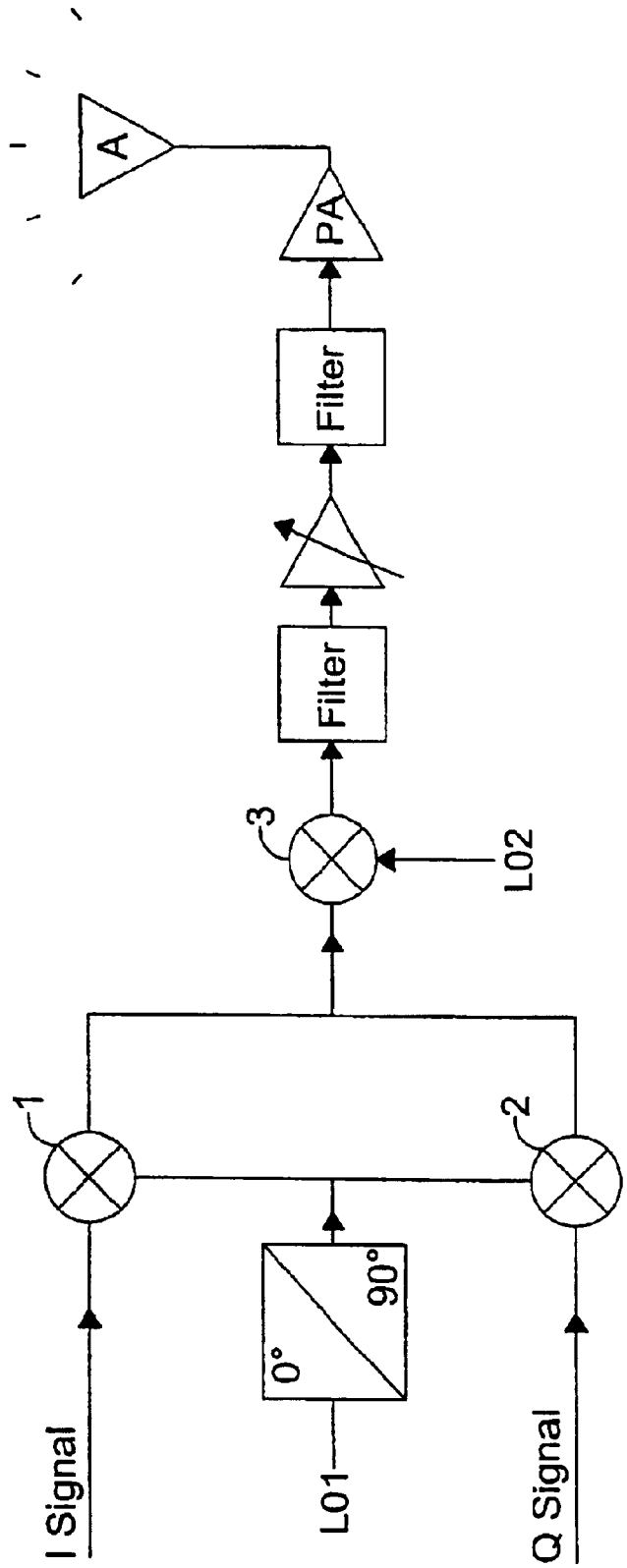
FIG. 1 is a schematic diagram illustrating a conventional dual-conversion transmitter.
Figure 2:
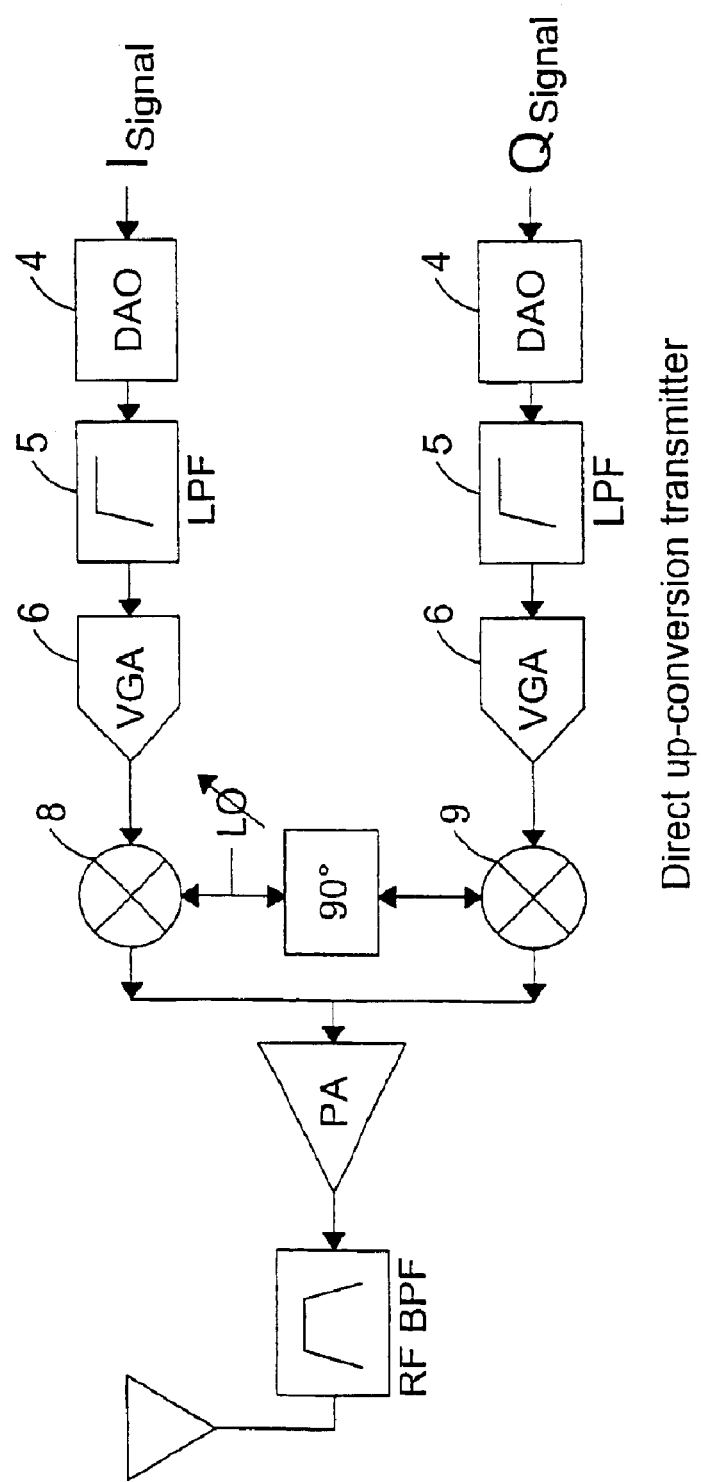
FIG. 2 is a schematic diagram illustrating a conventional direct-conversion transmitter.
Figure 3:
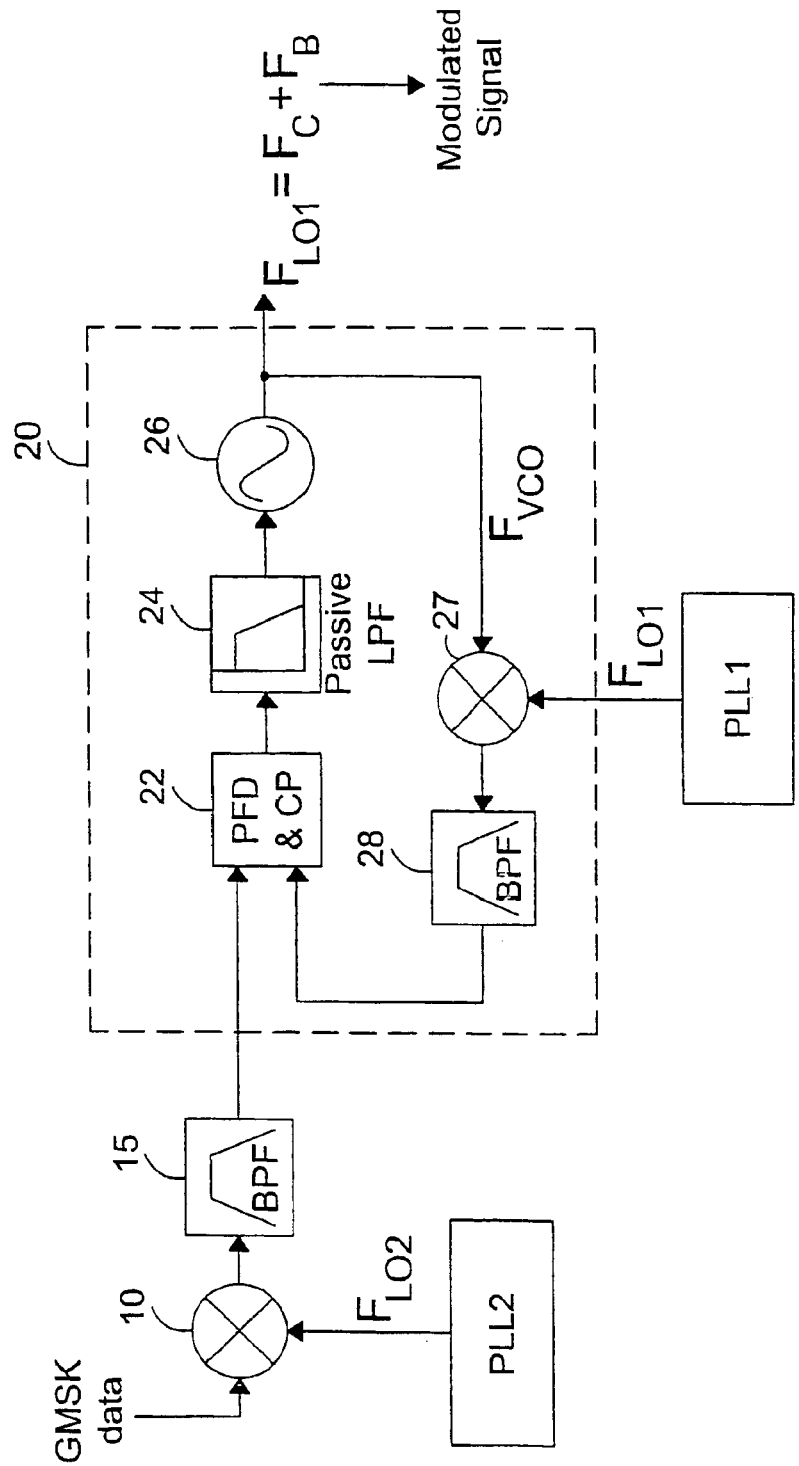
FIG. 3 is a schematic diagram illustrating a conventional translational-loop (or offset phase-locked-loop) transmitter.
Figure 4:
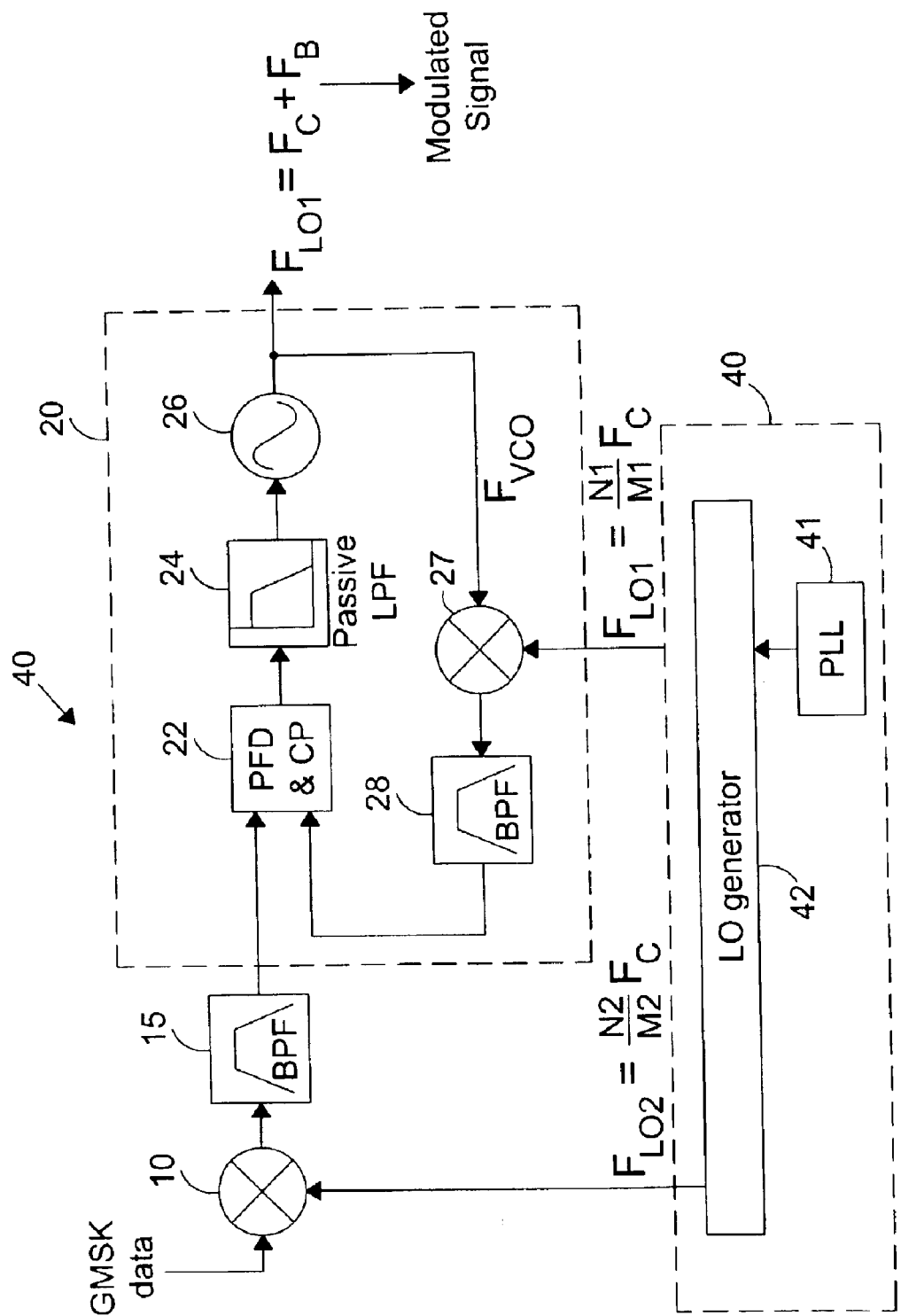
FIG. 4 is a schematic diagram illustrating a modulation portion of a translational-loop transmitter in accordance with a first embodiment of the present invention, which modulation portion uses a single PLL for local oscillator generation.

Referring to FIG. 4, a system for modulating signals in accordance with a first embodiment of the present invention uses a single oscillation unit 40 to generate the local oscillation signals in a translational-loop transmitter. The oscillation unit includes a phase-locked-loop (PLL) unit 41 connected to a local oscillation (LO) signal generator 42. (The remaining portions of the transmitter are similar to those in FIG. 3 and therefore like reference numerals have been used where applicable.)

Figure 5:
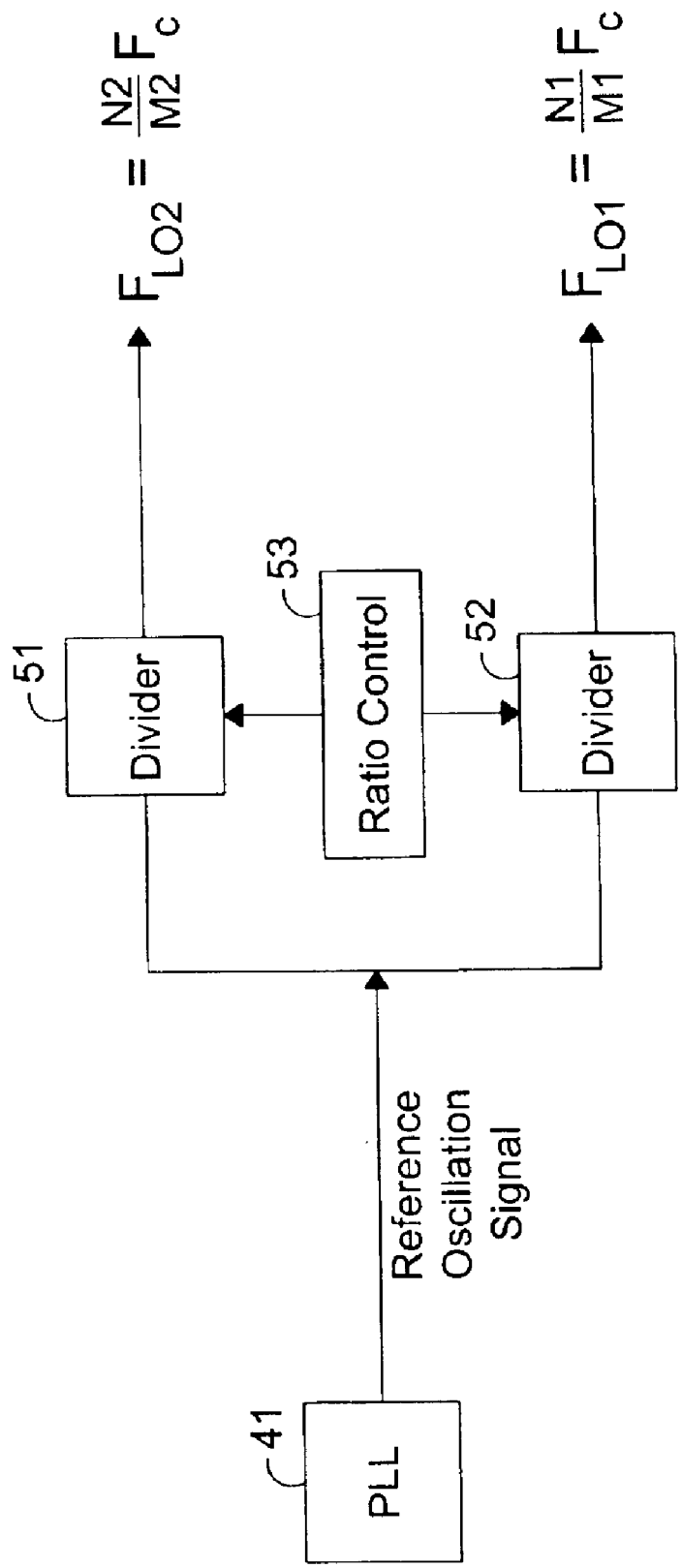
FIG. 5 is a schematic diagram illustrating an exemplary configuration of the LO signal generator shown in FIG. 4.

In operation, the PLL unit supplies the LO signal generator with a reference oscillation signal, and the LO signal generator generates two local oscillation signals from the reference signal. An exemplary configuration of the LO signal generator is shown in FIG. 5. In this figure, the LO signal generator is shown as including a first divider 51 and a second divider 52. The first divider generates a local oscillation signal $F_{LO2}$ which is input into mixer 10 so that the frequency of a signal GMSK data may be translated from a baseband frequency up to an intermediate frequency. A quadrature signal generator is preferable, because a single-sided up-conversion is required to get an intermediate frequency. The second divider generates a local oscillation frequency $F_{LO1}$ which is input into mixer 27 in the feedback loop portion of the second modulation section of the translational-loop transmitter. This oscillation frequency $F_{LO1}$ is used to generate control signal for adjusting VCO 26 that will result in translating the intermediate frequency signal output from filter 15 to a desired carrier frequency.

The LO signal generator generates local oscillation signals $F_{LO1}$ and $F_{LO2}$ in accordance with control signals from ratio control unit 53. In operation, this control unit sets the values of the divider units so that the frequencies $F_{LO1}$ and $F_{LO2}$ are harmonically related relative to the carrier frequency. Specifically, $F_{LO1}$ is generated so that it equals $$\frac{N_1}{M_1} F_C$$

and $F_{LO2}$ is generated so that it equals $$\frac{N_2}{M_2} F_C,$$

where $F_C$ is the desired carrier frequency of the transmitter. In order to generate signals of this type, the ratio control unit controls the division factors of units 51 and 52 so that they satisfy the following equations:

$$\left[\frac{N_1}{M_1} + \frac{N_2}{M_2}\right] = 1, \text{ where } M_1 \text{ and } N_1 \text{ are integer numbers} \quad (1)$$

$$\frac{N_i}{M_i} \times K \neq 1, \text{ where } K \text{ is an integer number} \quad (2)$$

$$\frac{N_1}{M_1} \times \frac{S}{R} = \frac{N_2}{M_2}, \text{ where } S \text{ and } R \text{ are integer numbers} \quad (3)$$

$$f_{LO1} + f_{LO2} = \left[\frac{N_1}{M_1} + \frac{N_2}{M_2}\right] fc = fc \quad (4)$$

Equations (1) and (4) make clear that local oscillation signals $F_{LO1}$ and $F_{LO2}$ represent different fractions of the carrier frequency ($f_C$) and that these fractions must add up to one. Equation (2) makes clear that neither fraction can be an integer multiple of 1. (For example, neither fraction can be ½ because when multiplied by integer 2 the result is 1). This is preferable to ensure that no harmonically related local oscillation signals are used to reduce the harmonic mixing and spurious leakage.

Equation (3) makes the relationship between the oscillations signals even more clear. For example, if S<R, then oscillation signal $F_{LO2}$ is a larger fraction of the carrier frequency than $F_{LO1}$. Some possible ways in which $F_{LO1}$ and $F_{LO2}$ may be non-harmonically related relative to a carrier frequency of the transmitter are set forth in the following table.

| $F_{LO1}$ | $F_{LO2}$ | Sum |
|---|---|---|
| (3/5) $f_c$ | (2/5) $f_c$ | $f_c$ |
| (4/7) $f_c$ | (3/7) $f_c$ | $f_c$ |
| (5/9) $f_c$ | (4/9) $f_c$ | $f_c$ |
| (7/9) $f_c$ | (2/9) $f_c$ | $f_c$ |

Figure 6:
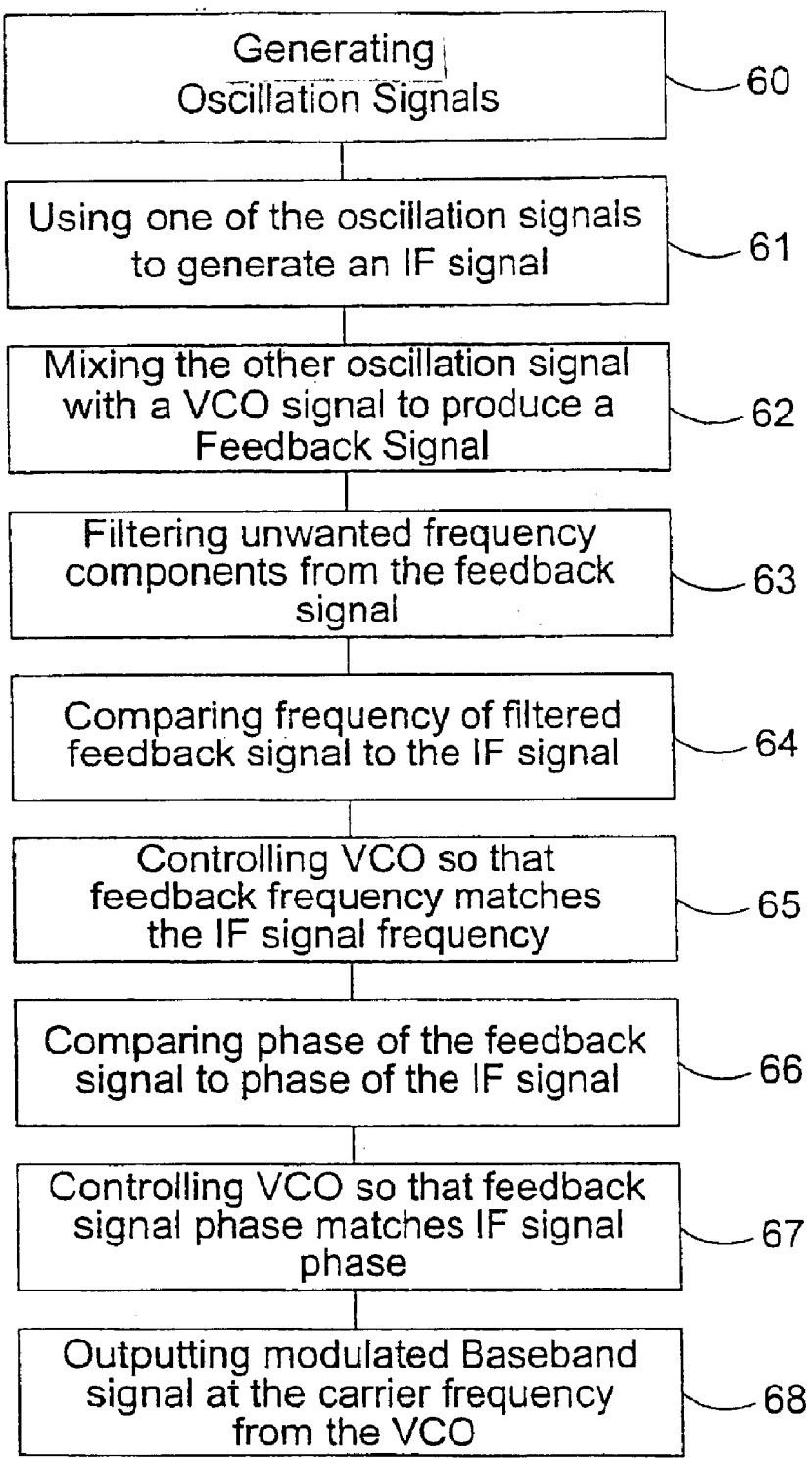
FIG. 6 is a flow diagram illustrating steps included in an embodiment of a method of the present invention.

Given the above equations, the exemplary situation may arise where $F_{LO1}$=⅗ $f_C$ and $F_{LO2}$=⅖ $f_C$. Under this set of circumstances, a translational-loop transmitter configured to receive oscillation signals in accordance with the present invention may operate as follows. This description is made with reference to FIG. 6 which shows steps included in a first embodiment of the method of the present invention.

In an initial step, PLL 41 outputs a reference oscillation signal to LO signal generator 42. The ratio control unit 53 in the LO signal generator inputs a division factor (depending upon the magnitude of the reference signal) so that divider units 51 and 52 output oscillation signals $F_{LO1}$ and $F_{LO2}$ which are non-harmonically related to the desired carrier frequency of the transmitter in a manner which satisfies Equations (1) through (4) above. (Block 60). In this example, $F_{LO1}$=⅗ $f_C$ and $F_{LO2}$=⅖ $f_C$.

In a modulation step, mixer 10 mixes an incoming baseband signal with oscillation signal $F_{LO2}$ output from the LO signal generator to produce an intermediate frequency signal at ⅖ $f_C$. (Block 61). This signal is then filtered by band-pass filter 15 to remove unwanted (e.g., mirror) frequency components.

In a frequency translation step, the intermediate frequency signal is translated to a carrier frequency using oscillation signal $F_{LO1}$. In performing this translation, the intermediate frequency signal serves as a reference frequency for controlling the output voltage of voltage-controlled oscillator 26. This is accomplished in accordance with the following steps. First, the voltage-controlled oscillator (VCO) outputs a signal at a preset frequency $F_{VCO}$, and the mixer 27 mixes this signal with local oscillation signal $F_{LO1}$=⅗ $f_C$ output from the LO signal generator. (Block 62). The output of the mixer contains two mirror frequencies $F_{VCO}$+$F_{LO1}$ and $F_{VCO}$−$F_{LO1}$. The band-pass filter 28 removes the higher-frequency signal and inputs the lower-frequency signal into the PFD & CP unit 22. (Block 63).

The PFD & CP unit determines whether the frequency of the IF signal output from filter 15 matches the frequency of the signal output from filter 28. (Block 64). If these signals do not match, the PFD & CP unit generates a difference signal indicating the amount by which the frequencies do not match. This difference signal is filtered by filter 22 and input into the VCO to control the frequency of $F_{VCO}$ so that the frequency output from filter 28 will match the IF signal frequency, i.e. so that $F_{VCO}$−$F_{LO1}$ is equal to $F_{LO2}$. (Block 65).

Once a frequency match exists between these two signals, the PFD & CP unit compares the phase of the signal output from filter 28 with the phase of the IF signal. (Block 66). If there is a mismatch, the PFD & CP unit outputs a difference signal which adjusts the VCO output until the phase of the signal output from filter 28 matches the phase of the IF signal. (Block 67). When the frequency and phase of the output of filter 28 match the same parameters of the IF signal, the frequency of the VCO will be set to the desired carrier frequency $f_c$. This is clear from Equation (4) which makes evident that the VCO outputs a frequency which is equal to $F_{LO1}$+$F_{LO2}$=(⅖+3/5)$f_c$=$f_C$. The VCO thus outputs the modulated baseband signal at the carrier frequency to an antenna for transmission. (Block 68).

Figure 7:
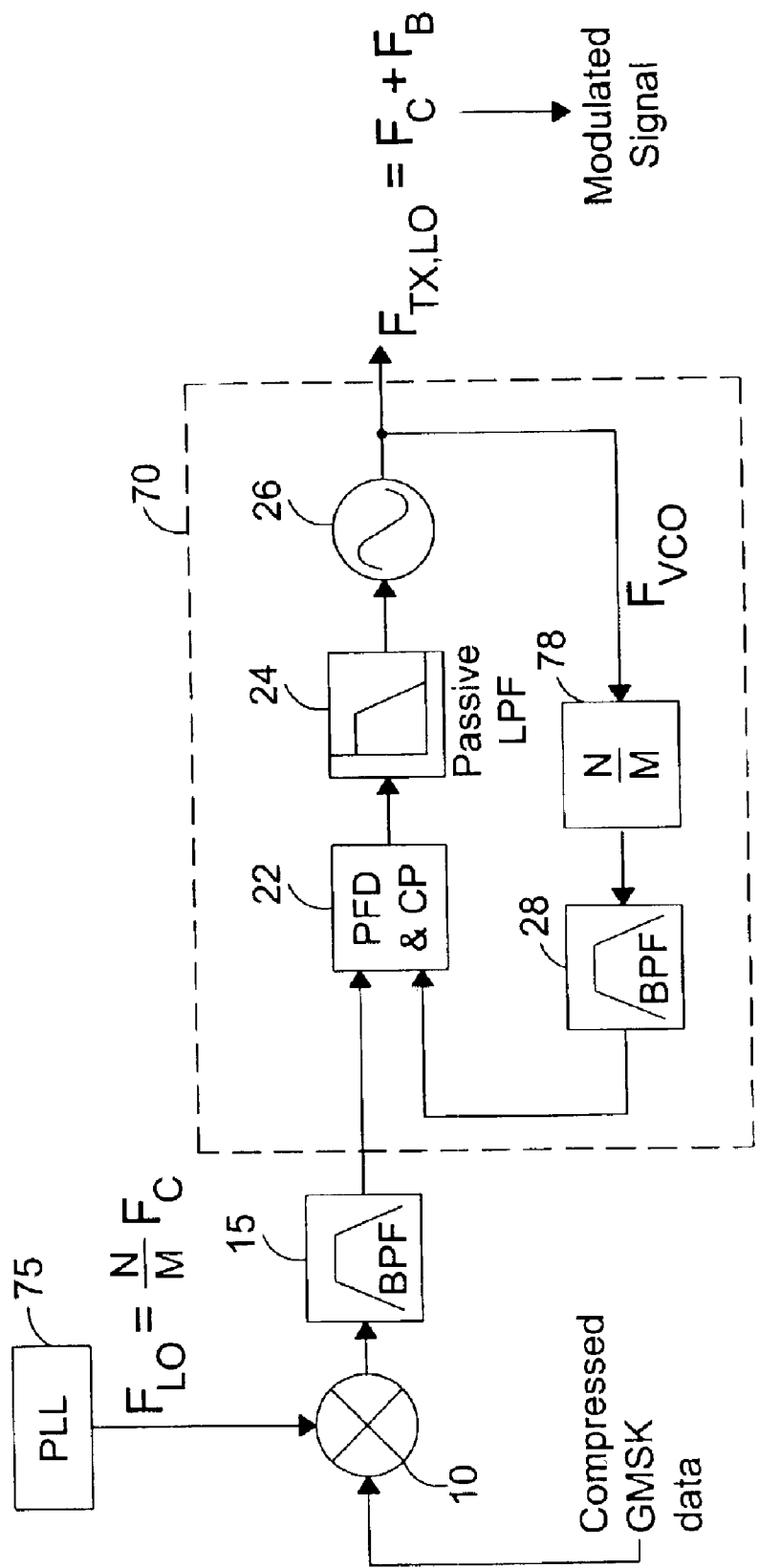
FIG. 7 is a schematic diagram illustrating a modulation portion of a translational-loop transmitter in accordance with a second embodiment of the present invention.

Referring to FIG. 7, a system for modulating signals in accordance with a second embodiment of the present invention differs from the first embodiment in two respects. The first difference relates to the manner in which the local oscillation signals are produced. Unlike the first embodiment, the second embodiment generates only one local oscillation signal in order to modulate a baseband signal up to a desired carrier frequency. This oscillation signal is generated by a phase-locked-loop (PLL) unit 75, which outputs oscillation signal $F_{LO}$ to mixer 10 in order to generate an intermediate frequency signal which is subsequently filtered by band-pass filter 15.

The second difference relates to the way in which frequency translation is performed up to the carrier frequency. Unlike the first embodiment, this frequency translation is not performed based on a local oscillation signal. Instead, the mixer 27 in FIG. 4 is replaced with a frequency divider unit 78. The frequency divider is set to divide the output of the VCO frequency $F_{VCO}$ by an amount which causes filter 28 to output a signal which equals the frequency of the IF signal output from filter 15. Thus, if the oscillation signal $F_{LO}$ is a fraction N/M of the carrier frequency $F_C$, divider 78 is set to divide the output of the voltage-controlled oscillator by the same amount N/M.

In order to modulate the desired carrier frequency using the embodiment of FIG. 7, the following additional equations must be satisfied:

$$f_{IF,IN} = \left[\frac{N}{M}\right] f_B \quad (5)$$

$$K \times \frac{N}{M} \neq 1 \quad (6)$$

where k is an integer number, $f_B$ represents the original information-bearing signal coming from baseband, and $f_{IF,in}$ represents the intermediate signal, which is one of the inputs of the mixer in offset PLL.

The above conditions must be met because of a certain compression that takes place with the input signal, which in the figure is labeled as compressed GMSK data. Since frequency divider 78 in the feedback path compresses the GMSK modulated input signal, the incoming data from the baseband modem may be expected to have a finer resolution by the factor noted in the Equation (5). If the feedback factor is not unusually large, the frequency translation may be performed without difficulty. The desired carrier signal generation can be obtained by the following calculations.

The output frequency of bandpass filter 28 becomes the output of the VCO divided by $$\frac{N}{M}, \frac{N}{M} f_{vco},$$

and the output of bandpass filter 15 becomes $$\frac{N}{M} f_c + \frac{N}{M} f_B.$$

Since the phase and frequency detector 22 tries to match the phase and frequency of its two input signals, the outputs of bandpass filter 15 and bandpass filter 28 will be the same. This means:

$$\frac{N}{M} f_{vco} = \frac{N}{M} f_c + \frac{N}{M} f_B \quad (7)$$

$$f_{VCO} = f_c + f_B \quad (8)$$

From Equation (8), it is clear that the modulated carrier signal may be achieved by proper design of the division factors.

The requirement of Equation (6) is similar to that of Equation (2) for the first embodiment of the invention. To prevent this condition from being violated and therefore to prevent possible impairment of the harmonics, the numerator N of the frequency divider should be different from 1. Furthermore, in order to satisfy Equation (6) any harmonic component of the LO signal should not fall into the desired carrier signal. Thus, frequency divider 78 may be used for the frequency generation as well as frequency division.

Figure 8:
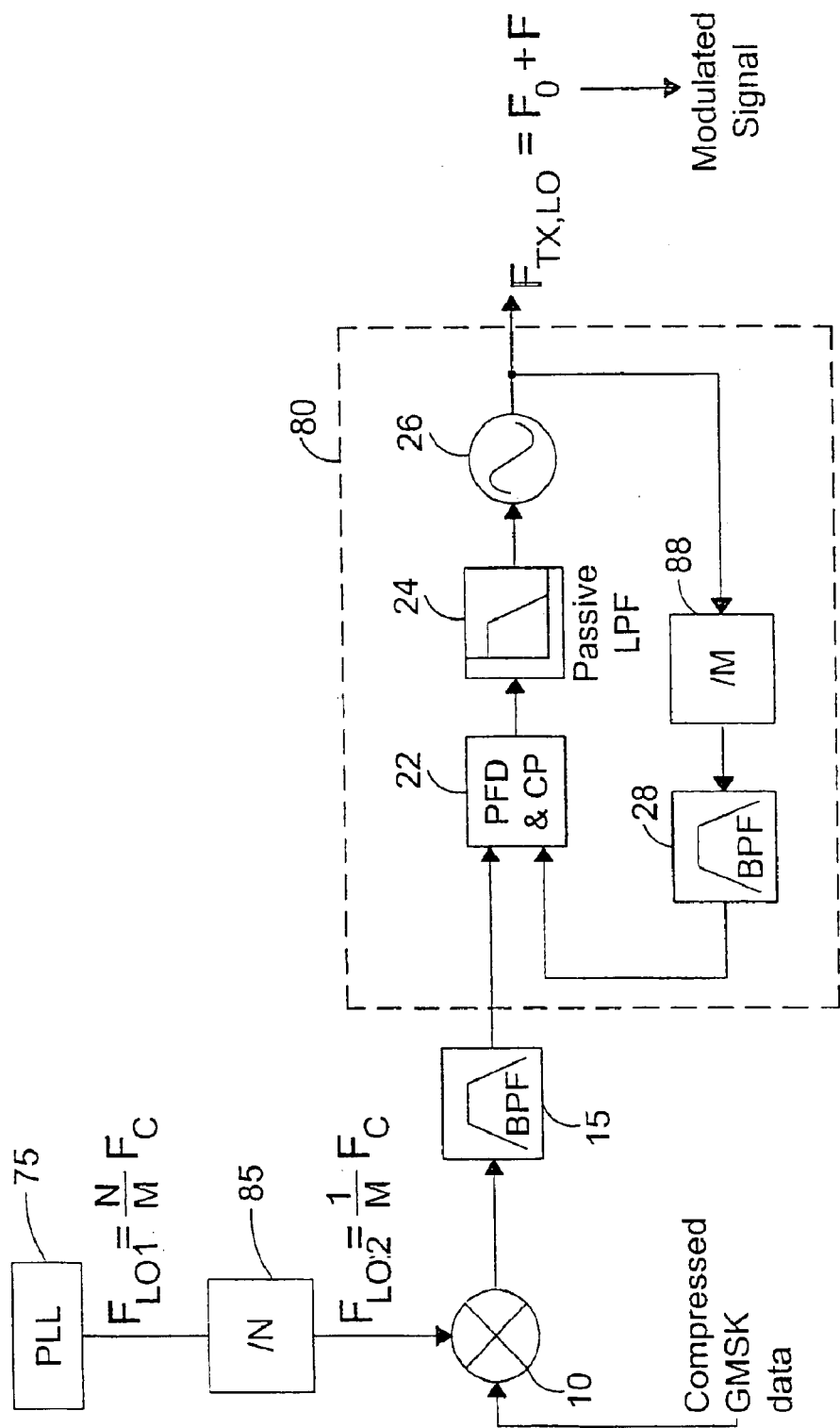
FIG. 8 is a schematic diagram illustrating a modulation portion of a translational-loop transmitter in accordance with a third embodiment of the present invention.

Referring to FIG. 8, a system for modulating signals in accordance with a third embodiment of the present invention is similar to the second embodiment with two exceptions. First, a running frequency divider 85 is included between the phase-locked-loop unit (PLL) 75 and mixer 10. This divider is set to divide the frequency output from the PLL 75 $F_{LO1}=N/M\ F_C$) by the fraction 1/N. The oscillation signal output from frequency divider 85 is therefore equal to $F_{LO2}=1/M\ F_C$.

Second, in order to match the IF signal input into the PFD & CP unit, a integer divider 88 having a dividing factor of 1/M is included in the feedback loop of control unit 80. One advantage of this divider is that it can be designed as a simple integer-N divider, not a fractional divider which is considerably more complicated. Nevertheless, the VCO frequency with high spectral leakage is not harmonically related to the carrier frequency and thus this advantage of the present invention can be maintained.

Figure 9:
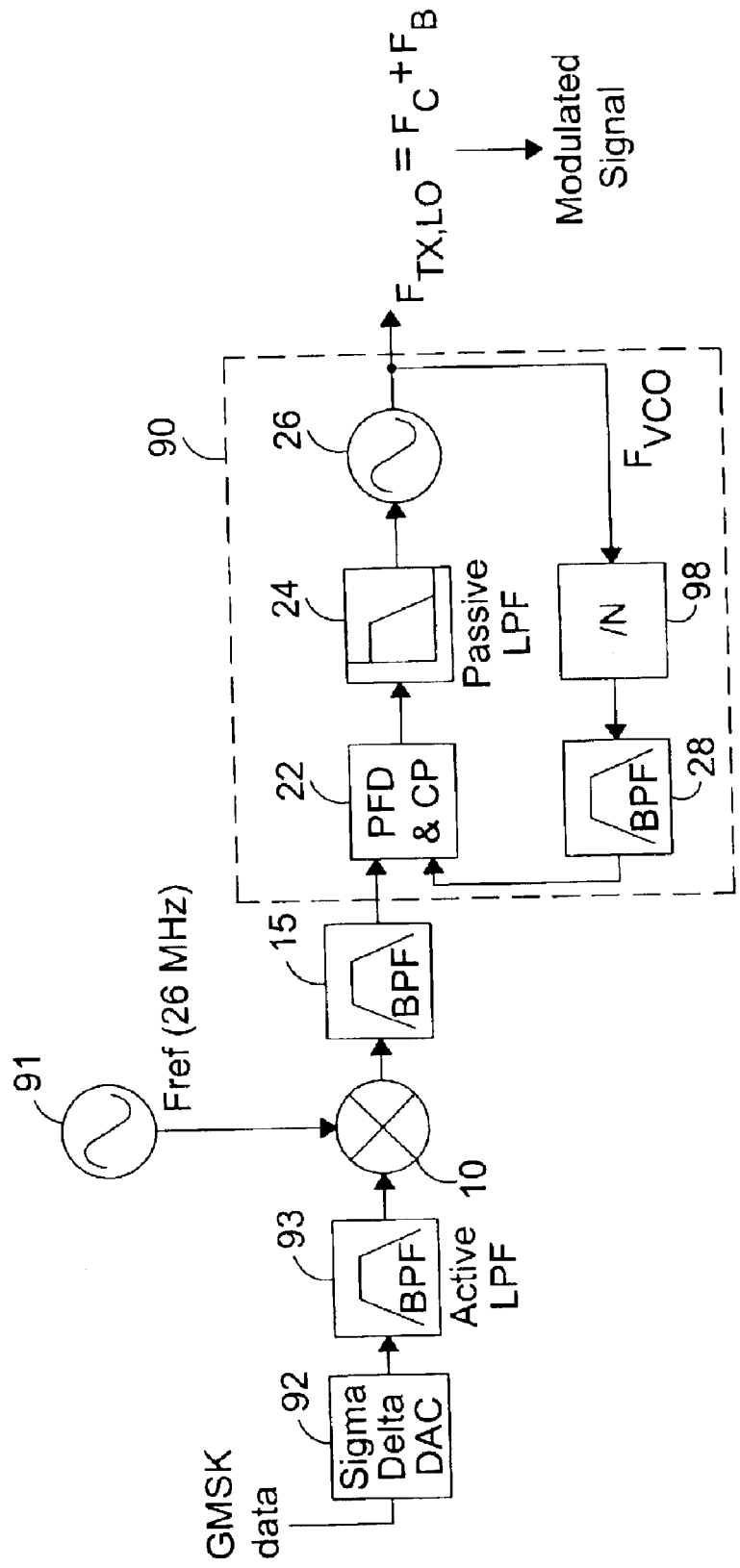
FIG. 9 is a schematic diagram illustrating a modulation portion of a translational-loop transmitter in accordance with a fourth embodiment of the present invention.

Referring to FIG. 9, a system for modulating signals in accordance with a fourth embodiment of the present invention does not use phase-locked-loop circuits to modulate a baseband signal up to a desired carrier frequency. In performing signal modulation, an oscillator 91 inputs a local oscillation signal in the form of a crystal reference frequency $F_{ref}$ into mixer 10 in order to convert a baseband signal into an intermediate frequency signal. In this case, the effective compression ratio increases and thus a more accurate baseband signal is required in order to meet a required modulation accuracy.

In order to provide a more accurate baseband signal, the signal (GMSK data) in its digital form may be converted into an analog signal using a sigma-delta digital-to-analog converter 92. This type of converter is preferable because it has very high resolution and thus is able to output a baseband signal with the accuracy required to achieve proper modulation with the crystal reference frequency. Before being input into the mixer, the analog signal may be filtered by active low-pass filter 93 to remove unwanted quantization noise.

Mixer 10 outputs an intermediate frequency signal at the reference frequency of the crystal oscillator. This frequency is depicted as 26 MHz, but those skilled in the, art can appreciate that other crystal oscillator frequencies may just as easily be used. In this invention, the PLL for local signal generation may no longer be required. This significantly reduces the amount of hardware required to implement the system and associated current consumption. Using a crystal oscillation frequency to produce the local oscillation signal, instead of a PLL, is advantageous because of its high stability and high Q factor.

After the intermediate frequency signal is generated, it is filtered by band-pass filter 15 and then input into control unit 90 which translates the signal up to carrier frequency. In order to perform this function, a frequency divider 98 is employed in the feedback loop in order to reduce the frequency of the voltage-controlled oscillator to a value which equals the frequency of the intermediate frequency signal. This is accomplished by setting factor N of the frequency divider to a value so that $F_{VCO}/N$=the crystal oscillator frequency, which in this case is 26 MHz.

In summary, the present invention represents a significant improvement over conventional translational-loop transmitters because it uses fewer phase-locked-loop circuits to generate the local oscillation signals required to modulate a baseband signal to carrier frequency. As shown in FIG. 3, conventional transmitters of this type use two PLL circuits to generate the oscillation signals required for converting a baseband signal to carrier frequency. The first through third embodiments of the present invention perform this function using a single PLL, and the fourth embodiment modulates a baseband signal using no PLL circuits. As a result, the present invention is able to reduce the physical dimensions and cost of mobile handsets as well as its power requirements, thereby improving miniaturization and providing for a longer battery life.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for generating oscillation signals, comprising:

generating a first oscillation signal from a reference oscillation signal; and generating a second oscillation signal from the reference oscillation signal;

wherein the first oscillation signal and the second oscillation signal relative are non-harmonically related relative to a desired carrier frequency, wherein the first oscillation signal is equal to $$\frac{N_1}{M_1} F_C$$

and the second oscillation signal is equal to $$\frac{N_2}{M_2} F_C,$$

where $F_c$ is said desired carrier frequency, and wherein:

$$\left[\frac{N_1}{M_1} + \frac{N_2}{M_2}\right] = 1, \text{ where } M_i \text{ and } N_i \text{ are integer numbers,}$$

$$\frac{N_i}{M_i} \times K \neq 1, \text{ where } K \text{ is an integer number}$$

and $i$ is an integer number, and $$\frac{N_1}{M_1} \times \frac{S}{R} = \frac{N_2}{M_2}, \text{ where } S \text{ and } R \text{ are integer numbers.}$$

2. The method of claim 1, further comprising: mixing the second oscillation signal with a baseband signal to generate an intermediate frequency signal; and setting a frequency of a voltage-controlled oscillator in a translational-loop based on the first oscillation signal, said frequency of the voltage-controlled oscillator corresponding to said desired carrier frequency.

3. The method of claim 1, wherein the first oscillation signal and the second oscillation signal are generated from a single phase-locked loop device.

4. A system for generating oscillation signals, comprising:
a phase-locked-loop unit which generates a reference oscillation signal;
a local oscillator signal generator which generates a first oscillation signal and a second oscillation signal from the reference oscillation signal, wherein the first oscillation signal and the second oscillation signal are non-harmonically related relative to a desired carrier frequency, wherein the first oscillation signal is equal to $$\frac{N_1}{M_1} F_C$$

and the second oscillation signal is equal to $$\frac{N_2}{M_2} F_C,$$

where $F_c$ is said desired carrier frequency, and $$\left[\frac{N_1}{M_1} + \frac{N_2}{M_2}\right] = 1, \text{ where } M_i \text{ and } N_i \text{ are integer numbers,}$$

$$\frac{N_i}{M_i} \times K \neq 1, \text{ where } K \text{ is an integer number}$$

and $i$ is an integer number, and $$\frac{N_1}{M_1} \times \frac{S}{R} = \frac{N_2}{M_2}, \text{ where } S \text{ and } R \text{ are integer numbers.}$$

5. The system of claim 4, further comprising:
a first mixer which mixes the second oscillation signal with a baseband signal to generate an intermediate frequency signal; and
a translational-loop which receives an output of said first mixer, said translational-loop including a voltage-controlled oscillator having a frequency set based on the first oscillation signal, said frequency of the voltage-controlled oscillator corresponding to said desired carrier frequency.

6. The system of claim 5, wherein said translation-loop includes:
a second mixer which mixes an output of the voltage-controlled oscillator with the first oscillation signal to produce a feedback signal; and
a phase/frequency detector which compares the feedback signal to the intermediate frequency signal to derive a control signal for setting the voltage-controlled oscillator to said desired carrier frequency.

7. The system of claim 4, wherein the local oscillator signal generator generates the first oscillation signal and the second oscillation signal from a single reference oscillation signal, the single reference oscillation signal being output from a single phase-locked loop unit.

* * * * *